United States Patent
Hu et al.

(10) Patent No.: US 10,680,053 B1
(45) Date of Patent: Jun. 9, 2020

(54) DISPLAY PANEL, ARRAY SUBSTRATE, THIN-FILM TRANSISTOR AND FABRICATION METHOD THEREOF

(71) Applicants: Hefei Xinsheng Optoelectronics Technology Co., Ltd., Hefei (CN); BOE TECHNOLOGY GROUP CO., LTD., Beijing (CN)

(72) Inventors: Yingbin Hu, Beijing (CN); Liangchen Yan, Beijing (CN); Ce Zhao, Beijing (CN); Yuankui Ding, Beijing (CN); Yang Zhang, Beijing (CN); Yongchao Huang, Beijing (CN); Luke Ding, Beijing (CN); Jun Liu, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/441,422

(22) Filed: Jun. 14, 2019

(30) Foreign Application Priority Data

Nov. 23, 2018 (CN) .......................... 2018 1 1409462

(51) Int. Cl.
*H01L 27/00* (2006.01)
*H01L 29/00* (2006.01)
(Continued)

(52) U.S. Cl.
CPC ...... *H01L 27/3272* (2013.01); *H01L 27/3262* (2013.01); *H01L 27/3276* (2013.01);
(Continued)

(58) Field of Classification Search
CPC ............. H01L 27/3272; H01L 27/3262; H01L 27/3276; H01L 27/1225; H01L 27/124; H01L 27/127; H01L 27/1288; H01L 29/66969; H01L 29/78633; H01L 29/7869; H01L 2227/323; H01L 51/56;
(Continued)

(56) References Cited

U.S. PATENT DOCUMENTS 8,664,654 B2 * 3/2014 Lee ........................ H01L 29/786
257/43
9,799,717 B2 * 10/2017 Jung ................... H01L 27/3272
(Continued)

*Primary Examiner* — Nikolay K Yushin
(74) *Attorney, Agent, or Firm* — Thomas | Horstemeyer, LLP

(57) ABSTRACT

A fabrication method for fabricating a thin-film transistor includes: forming a light shielding layer on a substrate; forming a buffer layer covering the light shielding layer, and forming a semiconductor material layer stacked on a surface of the buffer layer away from the substrate; forming a through hole penetrating through the buffer layer and the semiconductor material layer; patterning the semiconductor material layer to form an active layer covering a partial region of the buffer layer; forming a gate insulator layer on a surface of the active layer away from the substrate and a gate stacked on a surface of the gate insulator layer away from the substrate; forming a source and a drain on the surface of the buffer layer away from the substrate; and forming a dielectric layer covering the gate, the source, the drain, and the buffer layer, and being recessed into the through hole to form a groove.

12 Claims, 10 Drawing Sheets

(51) Int. Cl.
   *H01L 27/32* (2006.01)
   *H01L 51/56* (2006.01)
   *H01L 27/12* (2006.01)
   *H01L 29/786* (2006.01)
   *H01L 29/66* (2006.01)

(52) U.S. Cl.
   CPC ............ *H01L 51/56* (2013.01); *H01L 27/124* (2013.01); *H01L 27/127* (2013.01); *H01L 27/1225* (2013.01); *H01L 27/1288* (2013.01); *H01L 29/66969* (2013.01); *H01L 29/7869* (2013.01); *H01L 29/78633* (2013.01); *H01L 2227/323* (2013.01)

(58) Field of Classification Search
   CPC . H01L 51/5204; H01L 51/5228; H01L 51/03; H01L 51/0034; H01L 51/002
   See application file for complete search history.

(56) References Cited

U.S. PATENT DOCUMENTS

| | | | |
|---|---|---|---|
| 9,934,723 B2* | 4/2018 | Lee | G09G 3/3233 |
| 2013/0256652 A1* | 10/2013 | Lee | H01L 29/786 |
| | | | 257/43 |
| 2015/0379923 A1* | 12/2015 | Lee | G09G 3/3233 |
| | | | 345/206 |
| 2017/0062542 A1* | 3/2017 | Jung | H01L 27/3272 |
| 2017/0162822 A1* | 6/2017 | Park | H01L 27/3258 |

\* cited by examiner

DISPLAY PANEL, ARRAY SUBSTRATE, THIN-FILM TRANSISTOR AND FABRICATION METHOD THEREOF

CROSS-REFERENCE TO RELATED APPLICATION

The present application claims priority to Chinese Patent Application No. 201811409462.3, filed Nov. 23, 2018, the entire contents of which are incorporated herein by reference.

TECHNICAL FIELD

The present disclosure generally relates to the field of display technologies and, more particularly, to a display panel, an array substrate, a thin-film transistor, and a fabrication method thereof.

BACKGROUND

Presently, display panels are more and more extensively applied. In particular, OLED (Organic Light Emitting Diode) display panels have been widely used in various display devices. In existing display panels, thin-film transistors are indispensable electronic devices. Taking a top-gate type thin-film transistor as an example, a buffer layer covers a light shielding layer, and an active layer is arranged in a region of the buffer layer corresponding to the light shielding layer. When the thin-film transistor is fabricated, it is necessary to provide a contact hole from which the light shielding layer is exposed for a dielectric layer and the buffer layer that are stacked and, then, a drain is connected to the light shielding layer through the contact hole.

However, the dielectric layer and the buffer layer are larger in thickness, and the dielectric layer and the buffer layer that are stacked are even larger in thickness, such that it is more difficult to provide the contact hole for the dielectric layer and the buffer layer that are stacked, and longer time is taken to do so. Therefore, photoresists are easily hardened in an etching process and, thus, are not easily to be removed, which has a negative effect on product yield.

It is to be noted that the above information disclosed in this Background section is only for enhancement of understanding of the background of the present disclosure and, therefore, it may contain information that does not form the related art that is already known to a person of ordinary skill in the art.

SUMMARY

According to an aspect of the present disclosure, there is provided a fabrication method of a thin-film transistor, including following steps:

forming a light shielding layer on a substrate;

forming a buffer layer covering the light shielding layer and forming a semiconductor material layer stacked on a surface of the buffer layer away from the substrate;

forming a through hole penetrating through the buffer layer and the semiconductor material layer, and the light shielding layer being exposed from the through hole;

patterning the semiconductor material layer to form an active layer covering a partial region of the buffer layer;

forming a gate insulator layer on a surface of the active layer away from the substrate and a gate stacked on a surface of the gate insulator layer away from the substrate;

forming a source and a drain on the surface of the buffer layer away from the substrate; and forming a dielectric layer covering the gate, the source, the drain, and the buffer layer, the dielectric layer being recessed into the through hole in correspondence to a region of the through hole to form a groove.

In an exemplary embodiment of the present disclosure, the forming of a gate insulator layer on the surface of the active layer away from the substrate and a gate stacked on a surface of the gate insulator layer away from the substrate includes:

forming an insulating material layer covering the active layer and the buffer layer;

forming the gate on a surface of the insulating material layer away from the active layer, the gate covering a partial region of the insulating material layer, and an orthographic projection of the gate on the active layer being positioned within the active layer; and patterning the insulating material layer to form the gate insulator layer.

In an exemplary embodiment of the present disclosure, the active layer includes a peripheral region and a channel region positioned in the peripheral region.

The patterning the insulating material layer to form the gate insulator layer includes:

removing a region of the insulating material layer not covering the channel region to form the gate insulator layer, an orthographic projection of the gate insulator layer on the active layer coinciding with the channel region.

The forming of a gate insulator layer on a surface of the active layer away from the substrate includes:

conducting at least a portion of the peripheral region to form the source and the drain respectively positioned on two sides of the channel region.

In an exemplary embodiment of the present disclosure, the fabrication method further includes:

forming a contact hole from which the light shielding layer is exposed along the groove;

forming a first via hole, a second via hole, and a third via hole on the dielectric layer, the gate being exposed from the first via hole, the source being exposed from the second via hole, and the drain being exposed from the third via hole; and forming a gate line, a source line, and a drain line arranged at intervals on the surface of the dielectric layer away from the active layer; the gate line being connected to the gate via the first via hole; the source line being connected to the source via the second via hole; and the drain line being connected to the drain via the third via hole and being connected to the light shielding layer via the contact hole.

In an exemplary embodiment of the present disclosure, the forming of a through hole penetrating through the buffer layer and the semiconductor material layer, and the light shielding layer being exposed from the through hole include:

forming a photoresist layer on a surface of the semiconductor material layer away from the buffer layer;

exposing and developing a photoresist layer via a gray-tone mask to facilitate the photoresist layer to form a removal region, a retention region, and a partial retention region, the removal region including an opening hole from which the semiconductor material layer is exposed, and the opening hole being positioned within the partial retention region; and etching the semiconductor material layer along the opening hole until the through hole from which the light shielding layer is exposed is formed.

In an exemplary embodiment of the present disclosure, the patterning of the semiconductor material layer to form an active layer covering a partial region of the buffer layer includes:

removing the partial retention region of the photoresist layer;

removing a region of the semiconductor material layer that is not covered by the retention region; and removing the retention region of the photoresist layer to form the active layer.

In an exemplary embodiment of the present disclosure, a surface of the dielectric layer away from the substrate includes a first face and a second face, wherein the first face parallels to and directly faces the gate, and the second face parallels to and directly faces the drain.

A spacing between the first face and the gate, a spacing between the second face and the drain, and a spacing between a bottom surface of the groove and the light shielding layer are equal.

According to an aspect of the present disclosure, there is provided a thin-film transistor comprising: a substrate; a light shielding layer formed on a substrate; a buffer layer covering the light shielding layer; an active layer covering a partial region of the buffer layer; a gate insulator layer formed on a surface of the active layer away from the substrate; a gate stacked on a surface of the gate insulator layer away from the substrate; a source and a drain formed on the surface of the buffer layer away from the substrate; a dielectric layer covering the gate, the source, the drain, and the buffer layer; a through hole penetrating through the buffer layer and the dielectric layer, and the light shielding layer being exposed from the through hole, the dielectric layer being recessed into the through hole in correspondence to a region of the through hole to form a groove; and a contact hole formed in the dielectric layer recessed into the through hole, and the light shielding layer being exposed from the through hole.

In an exemplary embodiment of the present disclosure, the thin-film transistor further comprises: a first via hole, a second via hole, and a third via hole formed on the dielectric layer, the gate being exposed from the first via hole, the source being exposed from the second via hole, the drain being exposed from the third via hole; and a gate line, a source line, and a drain line arranged at intervals on a surface of the dielectric layer away from the active layer; the gate line being connected to the gate via the first via hole; the source line being connected to the source via the second via hole; and the drain line being connected to the drain via the third via hole and being connected to the light shielding layer via the contact hole. According to an aspect of the present disclosure, there is provided an array substrate, which includes the thin-film transistor according to any one of the above embodiments.

According to an aspect of the present disclosure, there is provided a display panel, which includes the array substrate according to any one of the above embodiments.

It is to be understood that the above general description and the detailed description below are merely exemplary and explanatory, and do not limit the present disclosure.

BRIEF DESCRIPTION OF THE DRAWINGS

The accompanying drawings are incorporated in and constitute a part of this specification, illustrate embodiments conforming to the present disclosure and, together with the description, serve to explain the principles of the present disclosure. Understandably, the accompanying drawings in the following description show merely some embodiments of the present disclosure, and persons of ordinary skill in the art may still derive other drawings from these accompanying drawings without creative effort.

DETAILED DESCRIPTION

Exemplary embodiments will now be described more comprehensively by referring to accompanying drawings. However, these exemplary embodiments can be implemented in a variety of forms and should not be construed as being limited to the embodiments set forth herein. Rather, these embodiments are provided so that the present disclosure will be more thorough and complete and will fully convey the concepts of the exemplary embodiments to those skilled in the art. Throughout the drawings, similar reference signs indicate the same or similar structures, and their detailed description will be omitted.

Although this specification uses relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below." When a certain structure is "above" other structures, it can mean that a certain structure is integrally formed on other structures, or a certain structure is "directly" arranged on other structures, or a certain structure is "indirectly" arranged on other structures by means of another structure.

The terms "one", "a", "the" and "said" are representative of presence of one or more elements, constituent parts, etc. The terms "comprising" and "having" are representative of open-ended terms (i.e., meaning the presence of other elements, constituent parts, etc., in addition to listed elements, constituent parts, etc.). The terms "first", "second," "third," or the like are only used as labels, instead of indicating quantitative limitation.

In addition, the steps of the method in the present disclosure are described in a particular order in the accompanying drawings. However, this does not require or imply the execution of these steps necessarily according to the particular order. Also, this does not mean that the expected result cannot be implemented unless all the shown steps are executed. Additionally or alternatively, some steps may be omitted, a plurality of steps may be combined into one step for execution, and/or one step may be decomposed into a plurality of steps for execution.

Figure 1:
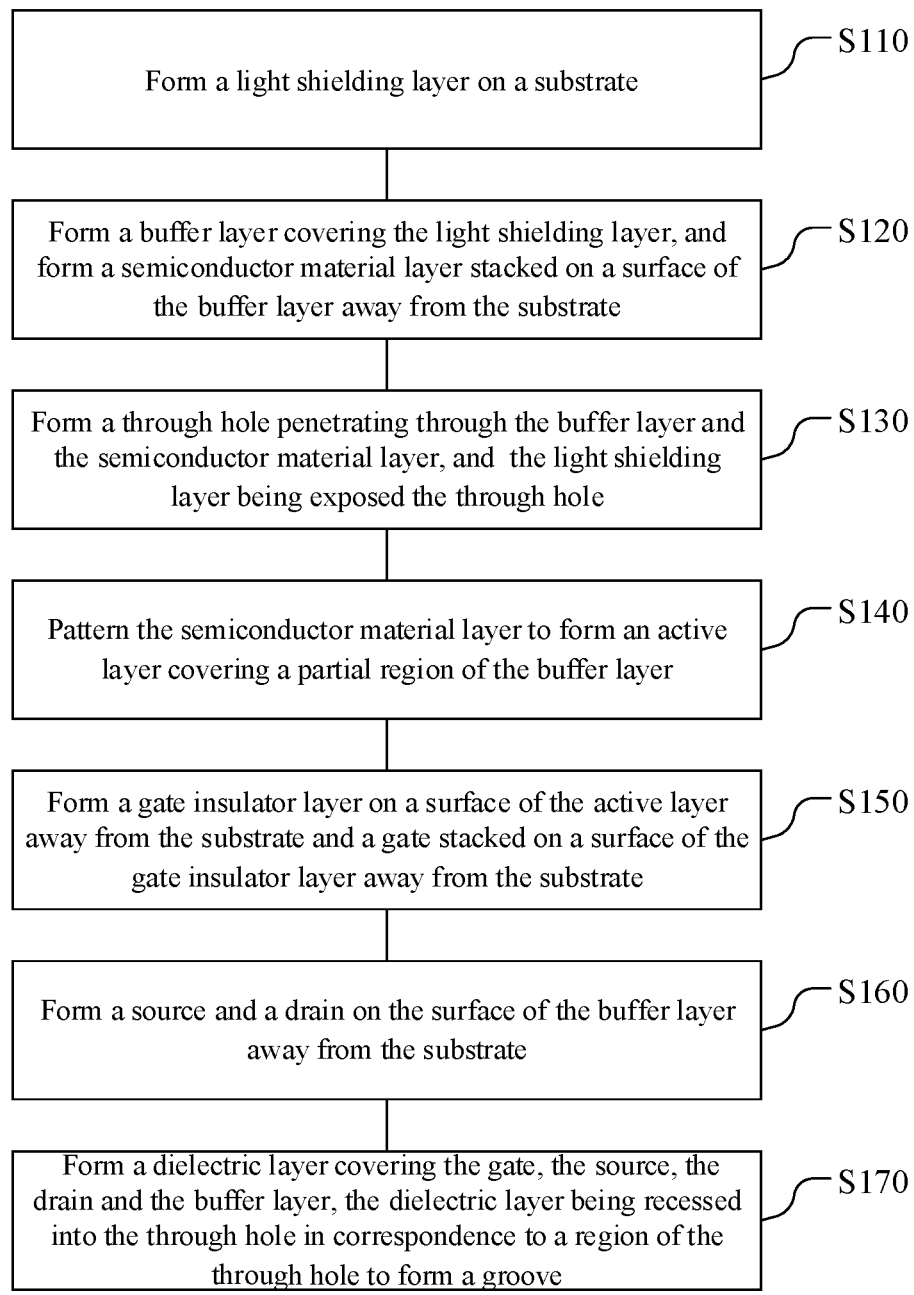
FIG. 1 is a flowchart of a fabrication method according to an embodiment of the present disclosure.

An embodiment of the present disclosure provides a fabrication method of a thin-film transistor. The thin-film transistor may be used in an organic light-emitting diode (OLED) display panel, and thin-film transistor may be a top-gate type thin-film transistor. As shown in FIG. 1, the fabrication method of this embodiment of the present disclosure may include:

Step S110: forming a light shielding layer on a substrate;
Step S120: forming a buffer layer covering the light shielding layer, and forming a semiconductor material layer stacked on a surface of the buffer layer away from the substrate;
Step S130: forming a through hole penetrating through the buffer layer and the semiconductor material layer, and the light shielding layer being exposed from the through hole;
Step S140: patterning the semiconductor material layer to form an active layer covering a partial region of the buffer layer;
Step S150: forming a gate insulator layer on a surface of the active layer away from the substrate and a gate stacked on a surface of the gate insulator layer away from the substrate;
Step S160: forming a source and a drain on the surface of the buffer layer away from the substrate; and
Step S170: forming a dielectric layer covering the gate, the source, the drain, and the buffer layer, where a region of the dielectric layer corresponds to the through hole to form a groove being recessed into the through hole.

According to the fabrication method provided by an embodiment of the present disclosure, before the dielectric layer is formed, a through hole has been provided on the buffer layer, and the light shielding layer is exposed in the through hole. A groove is formed in the dielectric layer at the location of the through hole. When forming the groove, the contact hole for connecting the drain and the light shielding layer, only the dielectric layer needs to be etched while the buffer layer is not etched, where the groove may allow the thickness of the dielectric layer at the location of the through hole to be reduced, which is advantageous to shortening etching time, reducing process difficulties, preventing the photoresist from being hardened, and, thus, improving product yield.

Steps of the fabrication method according to the embodiments of the present disclosure are described in detail below.

In Step S110, a light shielding layer is formed on a substrate.

Figure 6:
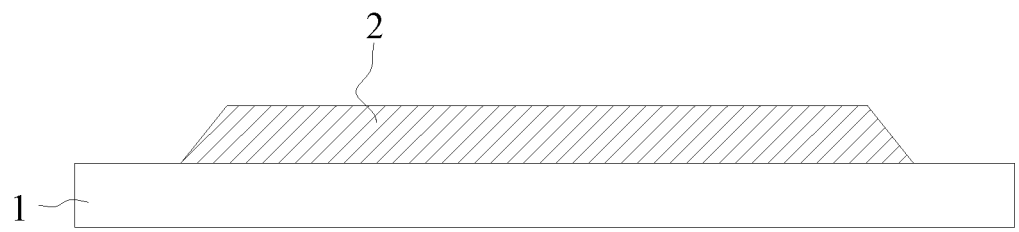
FIG. 6 is a schematic structural diagram of the thin film transistor fabricated by Step S110 of the fabrication method in FIG. 1.

As shown in FIG. 6, the light shielding layer 2 may be directly formed on the surface of the substrate 1 and cover a partial region of the substrate 1, and the material thereof is a light reflecting material. For example, the light shielding layer 2 may be metal, such as molybdenum, aluminum, copper, chromium, tungsten, titanium or tantalum or alloys thereof, which can reflect light. For example, the light shielding material layer may be formed on the surface of the substrate 1 by way of sputtering or vapor deposition, and, then, the patterning process may be performed on the light shielding material layer and patterned to obtain the light shielding layer 2, wherein the methods for the patterning process may be wet etching or dry etching. The light shielding layer 2 also may be formed by other fashion, such as printing.

In Step S120, the buffer layer covering the light shielding layer is formed, and the semiconductor material layer stacked on the surface of the buffer layer away from the substrate is formed.

Figure 7:
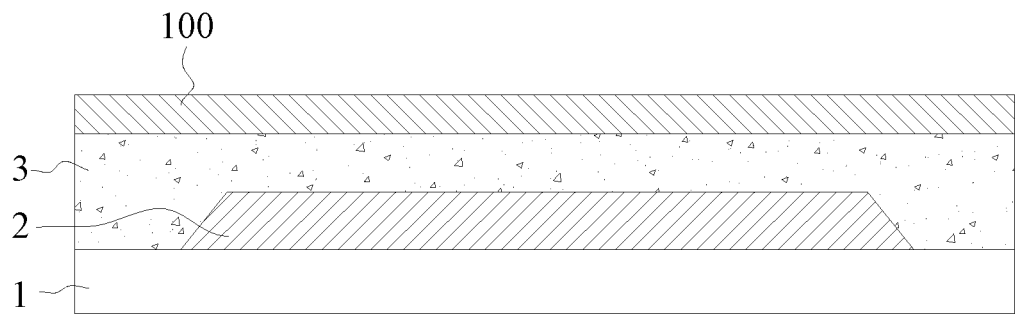
FIG. 7 is a schematic structural diagram of the thin film transistor fabricated by Step S120 of the fabrication method in FIG. 1.

As shown in FIG. 7, the buffer layer 3 may cover the light shielding layer 2 and the region of the substrate 1 that is not covered by the light shielding layer 2. The material of the buffer layer 3 may be an insulating material, such as silicon oxide or silicon nitride, and the material thereof is not particularly limited herein. The buffer layer 3 may be formed by chemical vapor deposition or other processes, and the process of forming the buffer layer 3 is not particularly limited herein.

The semiconductor material layer 100 may cover the surface of the buffer layer 3 away from the substrate 1, such that the semiconductor material layer 100 is stacked with the buffer layer 3. That is, the semiconductor material layer 100 may be formed after the buffer layer 3 is formed. The material of the semiconductor material layer 100 may be metal oxide, such as indium gallium zinc oxide (IGZO), but not limited thereto, and may also be one or more of aluminum zinc oxide (AZO), indium zinc oxide (IZO), zinc oxide (ZnO), indium oxide ($In_2O_3$), boron-doped zinc oxide (BZO), and magnesium-doped zinc oxide (MZO). In addition, the semiconductor material layer 100 may also be a polysilicon material or other material, which are not enumerated herein.

In Step S130, a through hole penetrating through the buffer layer and the semiconductor material layer is formed, and the light shielding layer is exposed from the through hole.

Figure 9:
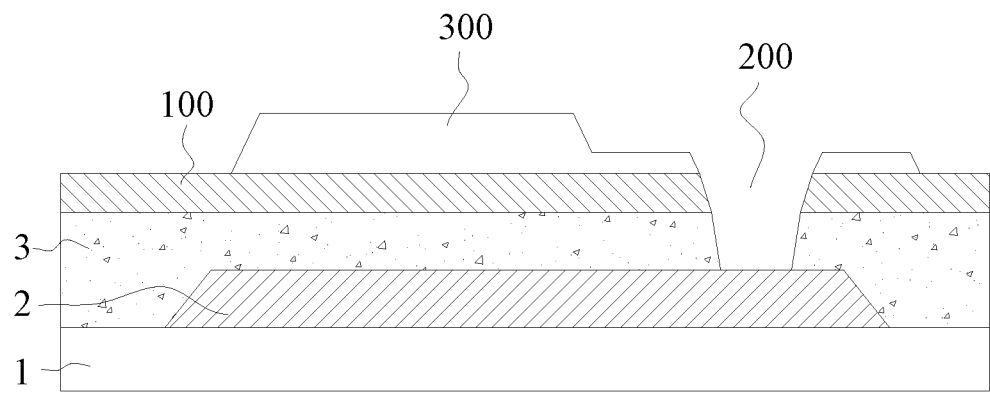
FIG. 9 is a schematic structural diagram of the thin film transistor fabricated by Step S1330 of the fabrication method in FIG. 2.

As shown in FIG. 9, the through hole 200 may penetrate through the semiconductor material layer 100 and the buffer layer 3, and a partial region of the light shielding layer 2 is exposed in or from the through hole 200.

Figure 2:
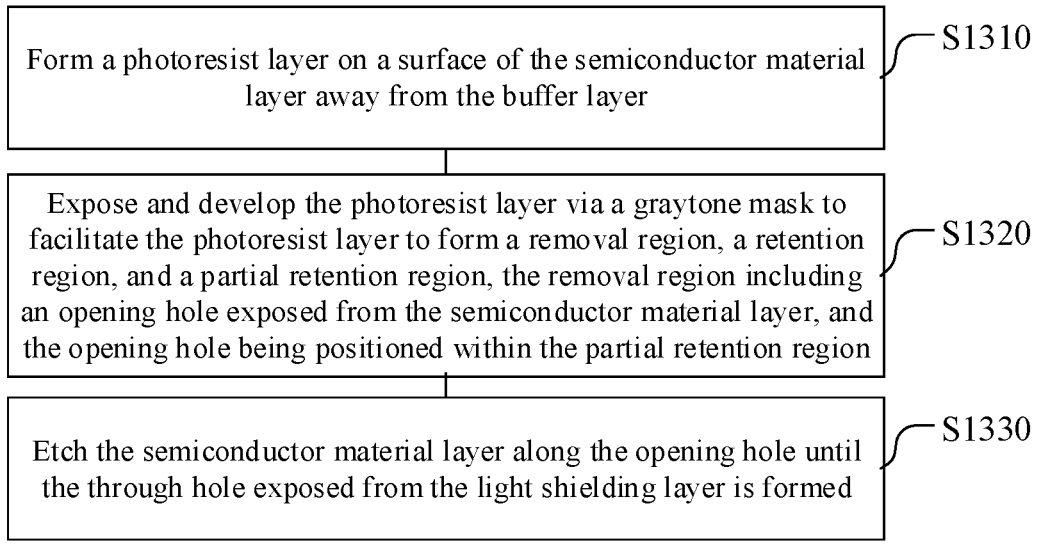
FIG. 2 is a flowchart of Step S130 of the fabrication method according to an embodiment of the present disclosure.

In an embodiment, the through hole 200 may be formed by a graytone mask process. As shown in FIG. 2, the Step S130 may include Steps S1310-S1330.

In Step S1310, a photoresist layer is formed on the surface of the semiconductor material layer away from the buffer layer.

The photoresist layer 300 may be formed on the surface of the semiconductor material layer 100 away from the buffer layer 3 by spin coating or by other means. The material of the photoresist layer 300 may be a positive photoresist or a negative photoresist, which may be covered on the surface of the semiconductor material layer 100 away from the buffer layer 3.

In Step S1320, the photoresist layer is exposed and developed via a graytone mask to facilitate the photoresist layer to form a removal region, a retention region, and a partial retention region. The removal region includes an opening hole from which the semiconductor material layer is exposed, and the opening hole is positioned within the partial retention region.

Figure 8:
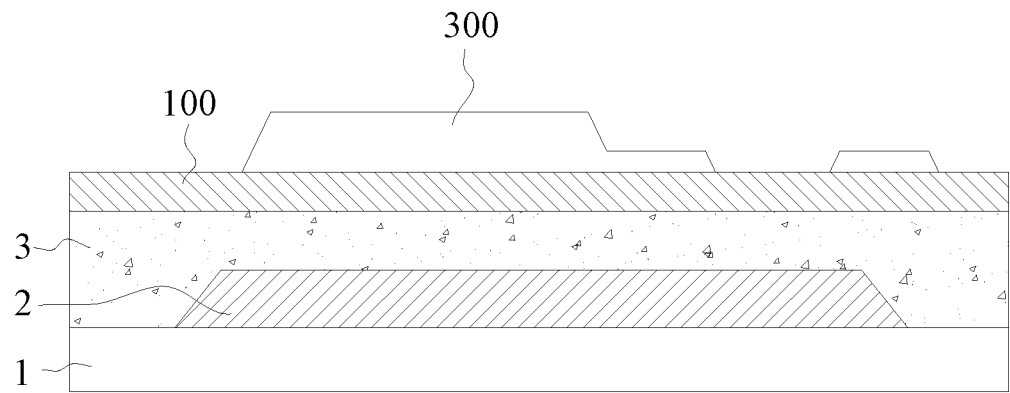
FIG. 8 is a schematic structural diagram of the thin film transistor fabricated by Step S1320 of the fabrication method in FIG. 2.

As shown in FIG. 8, the photoresist layer 300 may be exposed via a graytone mask to form an exposure region, a half exposure region, and a non-exposure region. Next, the photoresist layer 300 may be developed to form a removal region, a retention region, and a partial retention region. The removal region is exposed from the partial region of the semiconductor material layer 100; the retention region and the partial retention region cover the partial region of the semiconductor material layer 100; and the thickness of the retention region is greater than that of the partial retention region. Meanwhile, the removal region may include an opening hole from which the semiconductor material layer 100 is exposed, wherein the opening hole is positioned within the partial retention region, i.e., the opening hole penetrates through the partial retention region.

In Step S1330, the semiconductor material layer is etched along the opening hole until the through hole from which the light shielding layer is exposed is formed.

As shown in FIG. 9, the semiconductor material layer 100 and the buffer layer 3 may be respectively etched to form the through hole 200. For example, the exposed region of the semiconductor material layer 100 may be first etched via a wet etching process until the buffer layer 3 is exposed and, then, the buffer layer 3 is etched via a dry etching process until the light shielding layer 2 is exposed. In this way, the through hole 200 is obtained.

In Step S140, the semiconductor material layer is patterned to form an active layer covering a partial region of the buffer layer.

Figure 11:
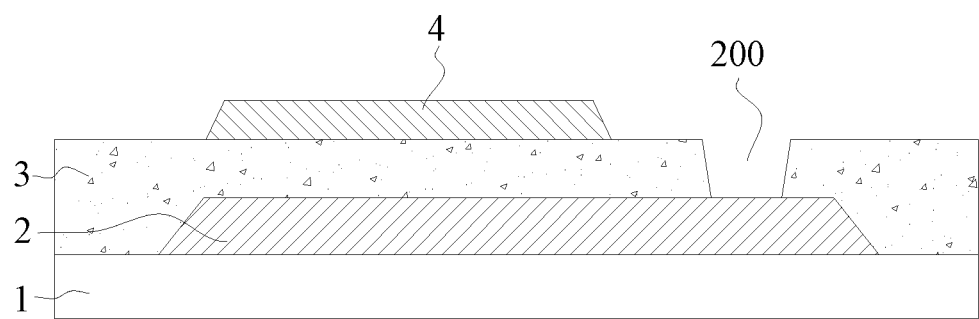
FIG. 11 is a schematic structural diagram of the thin film transistor fabricated by Step S1430 of the fabrication method in FIG. 3.

As shown in FIG. 11, the semiconductor material layer 100 may be patterned via a photolithographic process. That is, a partial region of the semiconductor material layer 100 is removed to obtain an active layer 4, wherein the active layer 4 may cover the partial region of the buffer layer 3.

Figure 3:
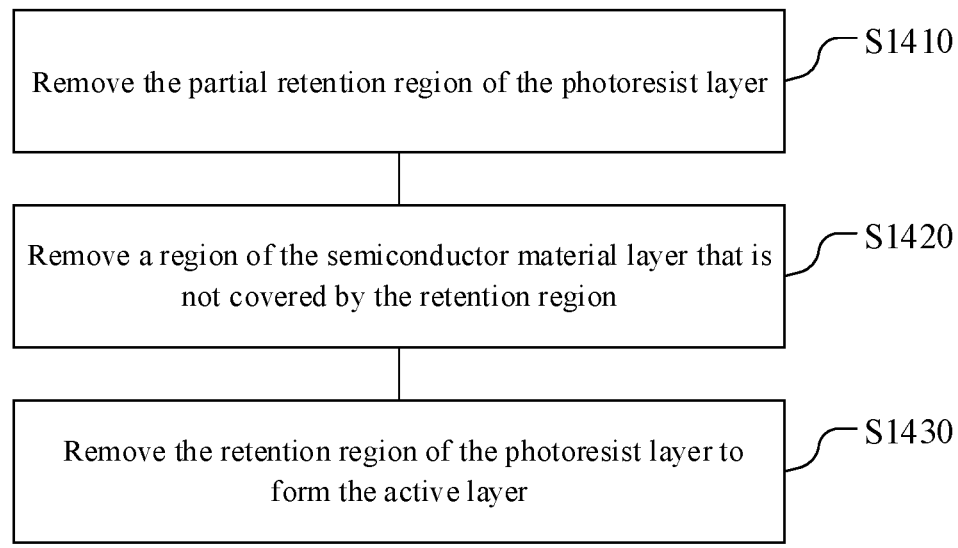
FIG. 3 is a flowchart of Step S140 of the fabrication method according to an embodiment of the present disclosure.

In an embodiment, the active layer 4 may be formed by a graytone mask process. Based on the above Step S1310-Step S1330, as shown in FIG. 3, Step S140 may include Step S1410-Step S1430.

In Step S1410, the partial retention region of the photoresist layer is removed.

Figure 10:
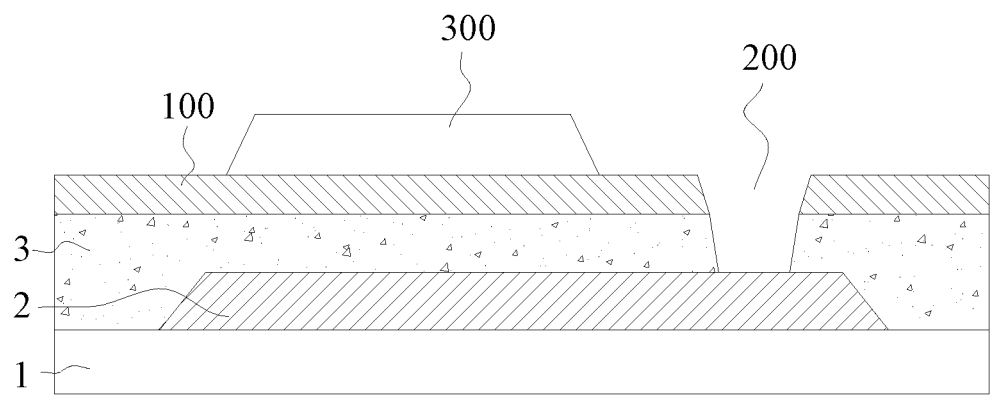
FIG. 10 is a schematic structural diagram of the thin film transistor fabricated by Step S1410 of the fabrication method in FIG. 3.

As shown in FIG. 10, the photoresist layer 300 may be processed via an ashing process or other processes until the partial retention region of the photoresist layer 300 is removed, such that the semiconductor material layer 100 corresponding to the partial retention region is exposed. Meanwhile, the photoresist layer 300 of the retention region is thinned.

In Step S1420, a region of the semiconductor material layer that is not covered by the retention region is removed.

The region of the semiconductor material layer 100 that is not covered by the retention region of the photoresist layer 300 may be removed via the wet etching process or other etching processes, and the region of the semiconductor material layer 100 that is covered by the retention region may serve as the active layer 4.

In Step S1430, the retention region of the photoresist layer is removed, and thus, the active layer is formed.

As shown in FIG. 11, the retention region of the photoresist layer 300 may be removed via the ashing process or other processes to completely remove the photoresist layer 300. In this way, the active layer 4 is obtained.

Through the graytone mask process in the above Step S130 and Step S140, the active layer 4 and the through hole 200 may be formed by one mask process without performing the masking process twice, thereby simplifying the processes and reducing process costs.

In Step S150, a gate insulator layer on a surface of the active layer away from the substrate and a gate stacked on a surface of the gate insulator layer away from the substrate are formed.

Figure 15:
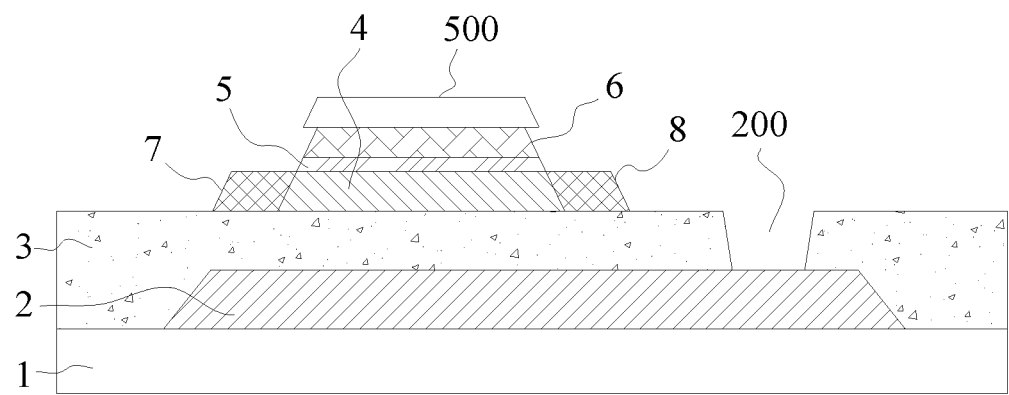
FIG. 15 is a schematic structural diagram of the thin film transistor fabricated by Step S160 of the fabrication method in FIG. 1.

As shown in FIG. 15, the gate insulator layer 5 may be stacked on the surface of the active layer 4 away from the substrate 1, and the material of the gate insulator layer 5 may be an insulating material, such as silicon oxide or silicon nitride, and the material thereof is not specially limited herein.

In addition, the active layer 4 may include a peripheral region and a channel region positioned in the peripheral region. The gate insulator layer 5 may only cover the channel region instead of covering the peripheral region. That is, the orthographic projection of the gate insulator layer 5 on the active layer 4 coincides with the channel region of the active layer 4. The active layer 4 also may not be divided into the peripheral region and the channel region, and the gate insulator layer 5 may completely cover the active layer 4.

The gate 6 may be stacked on the surface of the gate insulator layer 5 away from the active layer 4, and an edge of the orthographic projection of the gate 6 on the gate insulator layer 5 may coincide with an edge of the gate insulator layer 5, and may be positioned in the edge of the gate insulator layer 5. The material of the gate 6 may be molybdenum, aluminum, or copper, but is not limited thereto, and also may be chromium, tungsten, titanium, tantalum, and alloys thereof, etc., which are not enumerated herein.

Figure 4:
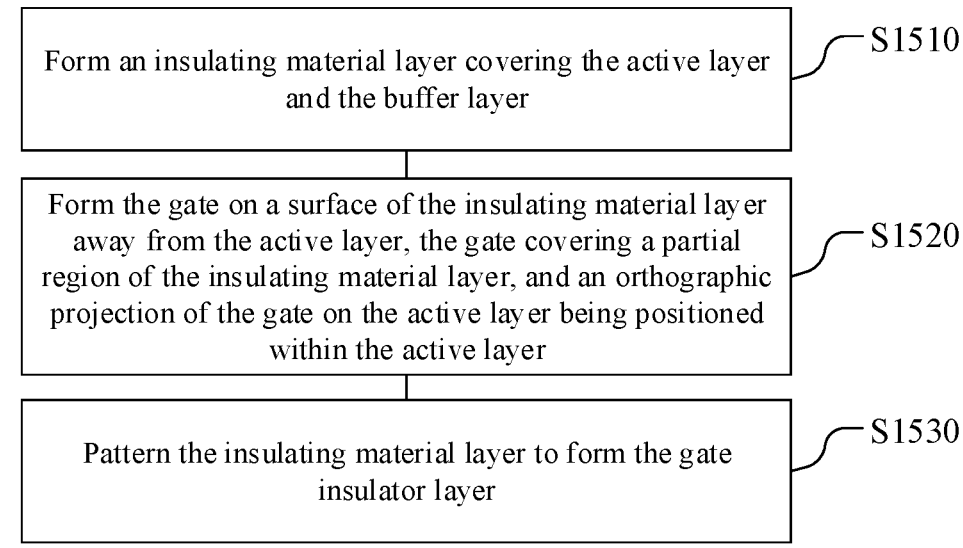
FIG. 4 is a flowchart of Step S150 of the fabrication method according to an embodiment of the present disclosure.

In an embodiment, as shown in FIG. 4, the Step S150 may include Step S1510-Step S1530.

In Step S1510, an insulating material layer covering the active layer and the buffer layer is formed.

Figure 12:
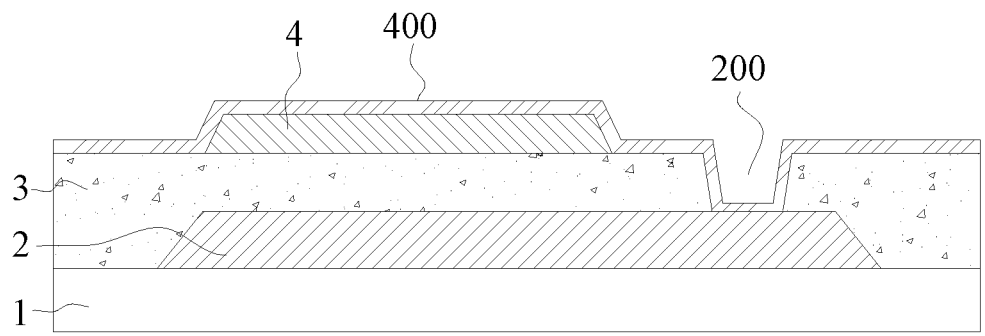
FIG. 12 is a schematic structural diagram of the thin film transistor fabricated by Step S1510 of the fabrication method in FIG. 4.

As shown in FIG. 12, an insulating material layer 400 may be formed by chemical vapor deposition or other processes on the buffer layer 3 on which the active layer 4 is formed, and the insulating material layer 400 covers the active layer 4 and the region of the buffer layer 3, which is not covered by the active layer 4. The material of the insulating material layer 400 may be an insulating material such as silicon oxide or silicon nitride, and the material thereof is not particularly limited herein.

In Step S1520, the gate is formed on a surface of the insulating material layer away from the active layer; the gate covers a partial region of the insulating material layer; and an orthographic projection of the gate on the active layer is positioned within the active layer.

Figure 13:
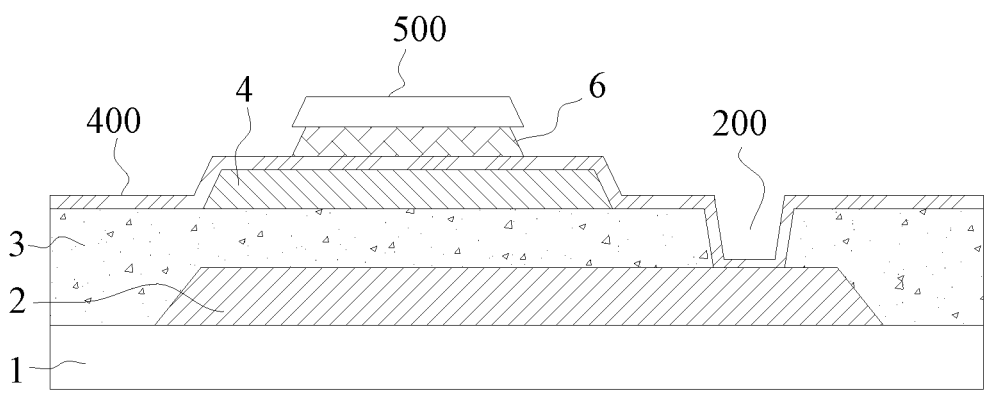
FIG. 13 is a schematic structural diagram of the thin film transistor fabricated by Step S1520 of the fabrication method in FIG. 4.

As shown in FIG. 13, the gate 6 may be formed on the surface of the insulating material layer 400 away from the active layer 4 via a mask process. For example, a gate material layer covering the insulating material layer 400 may be first formed and, thereafter, a gate photoresist layer 500 covering the gate material layer is formed. Next, the gate photoresist layer 500 is exposed and developed and, then, the gate material layer is patterned via dry etching or wet etching to obtain the gate 6.

The gate 6 may cover the partial region of the insulating material layer 400, and the orthographic projection of the gate 6 on the active layer 4 is positioned in the active layer 4. For example, for the active layer 4 having a channel region, the gate 6 may directly face the channel region of the active layer 4. That is, the orthographic projection of the gate 6 on the active layer 4 coincides with or is positioned in the channel region.

In Step S1530, the insulating material layer is patterned to form the gate insulator layer.

Figure 14:
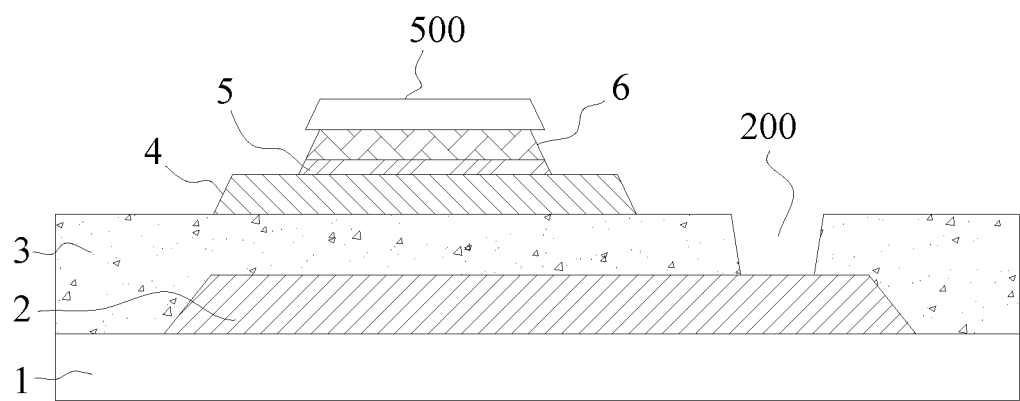
FIG. 14 is a schematic structural diagram of the thin film transistor fabricated by Step S1530 of the fabrication method in FIG. 4.

As shown in FIG. 14, after the gate 6 is formed, the gate photoresist layer 500 covering the gate 6 may be retained, and the insulating material layer 400 not covered by the gate may be etched via dry etching or other etching processes to obtain the gate insulator layer 5 and, then, the gate photoresist layer 500 covering the gate 6 is removed by ashing or other processes. In this regard, the utilization of the photoresist may be improved, which is advantageous to simplifying processes and reducing costs. The gate photoresist layer 500 covering the gate 6 may be removed before patterning the insulating material layer 400. When patterning the insulating material layer 400, the photoresist covering the gate 6 is formed. After the gate insulator layer 5 is obtained, the photoresist covering the gate 6 is removed.

In an embodiment, for the active layer 4 having the peripheral region and the channel region, the orthographic projection of the gate insulator layer 5 on the active layer 4 may coincide with the channel region. Thus, as shown in FIG. 14, the patterning of the insulating material layer 400 may include: removing the region of the insulating material layer 400 that does not cover the channel region of the active layer 4 to obtain the gate insulator layer 5 only covering the channel region of the active layer 4, such that the peripheral region of the active layer 4 is exposed to form the source and the drain.

In Step S160, a source and a drain are formed on the surface of the buffer layer away from the substrate.

The source 7 and the drain 8 may be positioned on the same surface of the buffer layer 3 as the active layer 4. That is, the buffer layer 3 is away from the surface of the substrate 1.

In an embodiment, for the active layer 4 having the peripheral region and the channel region, as shown in FIG. 15, the Step S160 may include:

conducting at least a portion of the peripheral region of the active layer 4 to form the source 7 and the drain 8 respectively positioned on two sides of the channel region. The source 7 may be positioned on a side of the channel region away from the through hole 200, and the drain 8 may be positioned between the channel region and the through hole 200. Conducting the peripheral region may be implemented either by an annealing process or by way of laser irradiation, and specific processes for conducting the peripheral region are not particularly limited herein, as long as the source 7 and the drain 8 can be formed.

In Step S170, a dielectric layer covering the gate and the buffer layer is formed, and the dielectric layer is recessed into the through hole in correspondence to a region of the through hole to form a groove.

Figure 16:
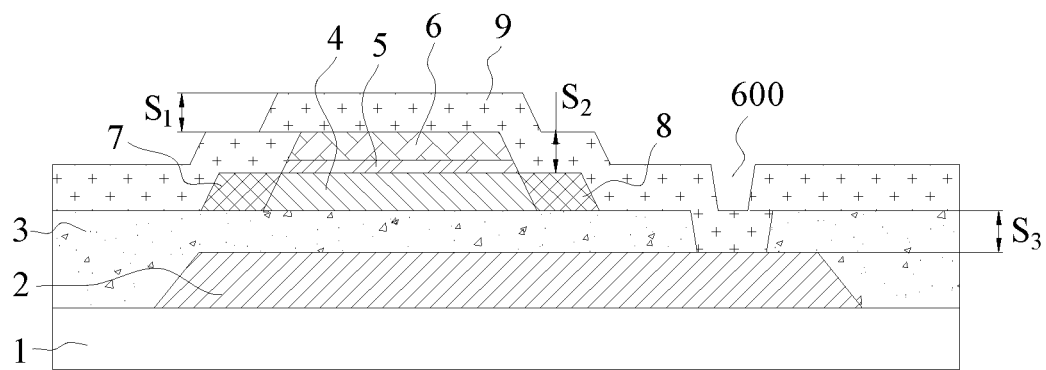
FIG. 16 is a schematic structural diagram of the thin film transistor fabricated by Step S170 of the fabrication method in FIG. 1.

As shown in FIG. 16, the dielectric layer 9 may be formed via chemical vapor deposition or other processes, and the dielectric layer 9 may cover the region of the gate 6 and the region of the buffer layer 3 that are not covered by the gate 6, and the material of the dielectric layer 9 may be insulating materials, such as silicon oxide, silicon nitride, etc. Meanwhile, the dielectric layer 9 may extend into the through hole 200 at a position corresponding to the through hole 200. That is, the dielectric layer 9 is recessed into the through hole 200, such that the dielectric layer 9 has the groove 600 corresponding to the through hole 200.

Furthermore, a surface of the dielectric layer 9 away from the substrate 1 includes a first face and a second face; the first face parallels to and directly faces the gate 6; and the second face parallels to and directly faces the drain 8. A spacing $S_1$ between the first face of the dielectric layer 9 and the gate 6, a spacing $S_2$ between the second face of the dielectric layer 9 and the drain 8, and a spacing $S_3$ between a bottom surface of the groove 600 and the light shielding layer 2 are equal, i.e., $S_1=S_2=S_3$, and $S_1$, $S_2$ and $S_3$ may be equal to the thickness of the buffer layer 3. Thus, the thickness of the dielectric layer 9 is more uniform and easily determined, which is advantageous to etching the dielectric layer 9 in a subsequent process.

Figure 5:
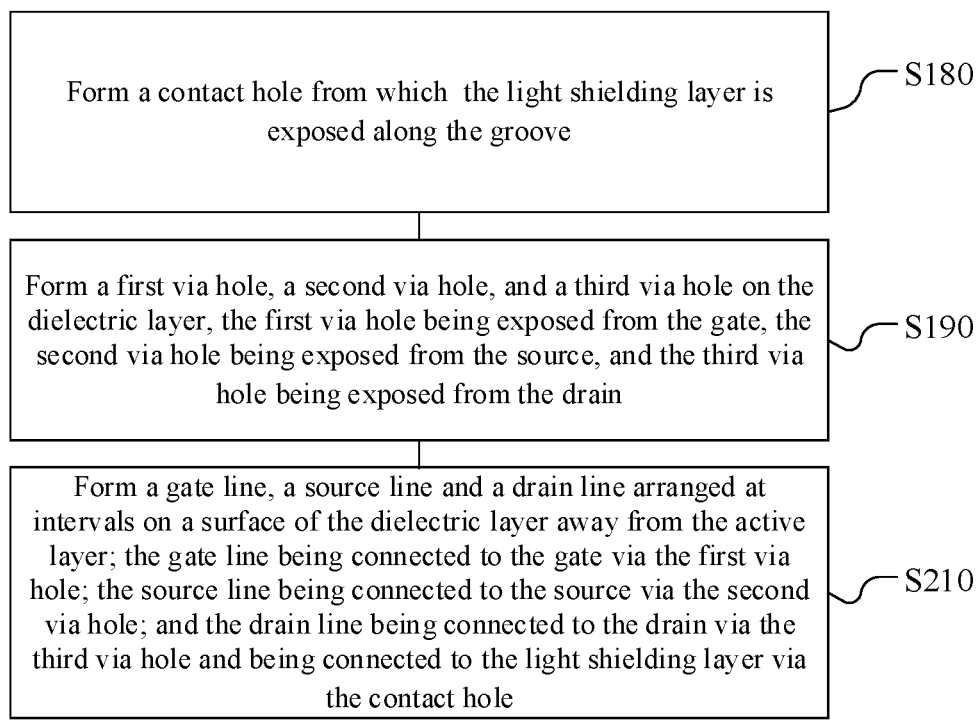
FIG. 5 is a flowchart of Steps S180-S210 of the fabrication method according to an embodiment of the present disclosure.

As shown in FIG. 5, the fabrication method of this embodiment of the present disclosure may also include Step S180-Step S210.

In Step S180, a contact hole, from which the light shielding layer is exposed, is formed along the groove.

A photoresist may be first formed on the dielectric layer 9. After exposure and development, the dielectric layer 9 may be etched along the groove 600 via a wet etching process until the light shielding layer 2 of the corresponding region is exposed. In this way, the contact hole 10 from which the light shielding layer 2 is exposed is obtained. The contact hole 10 may also be formed via dry etching or other processes.

The buffer layer 3 at the through hole 200 has been removed when forming the through hole 200 in Step S130. Therefore, when forming the contact hole 10, the dielectric layer 9 only needs to be etched by one mask process. Etching the buffer layer 3 may be carried out in the mask process of forming the active layer 4. Compared with the prior art, the number of times of a mask is processed may be reduced, thereby reducing processing difficulties and lowering processing costs.

In Step S190, a first via hole, a second via hole, and a third via hole are formed on the dielectric layer; the gate is exposed from the first via hole; the source is exposed from the second via hole, and the drain is exposed from the third via hole.

Figure 17:
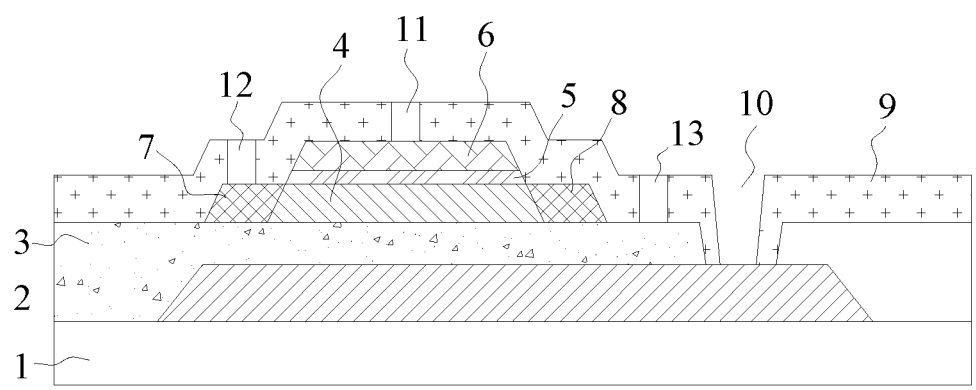
FIG. 17 is a schematic structural diagram of the thin film transistor fabricated by Step S190 of the fabrication method in FIG. 5.

As shown in FIG. 17, the spacing between the first face of the dielectric layer 9 and the gate 6, the spacing between the second face of the dielectric layer 9 and the drain, and the spacing between the bottom surface of the groove 600 and the light shielding layer 2 are equal. Therefore, the first via hole 11, the second via hole 12, and the third via hole 13 may be formed on the dielectric layer 9 by one mask process, and specific procedures of the mask process are not described in detail herein. The first via hole 11 directly faces the gate 6 and from which the gate 6 is exposed, the second via hole 12 directly faces the source 7 and from which the source 7 is exposed, and the third via hole 13 and the drain 8 directly face the drain 8 and from them the drain 8 are exposed.

In Step S210, a gate line, a source line, and a drain line arranged at intervals are formed on a surface of the dielectric layer away from the active layer. The gate line is connected to the gate via the first via hole. The source line is connected to the source via the second via hole. The drain line is connected to the drain via the third via hole, and is connected to the light shielding layer via the contact hole.

Figure 18:
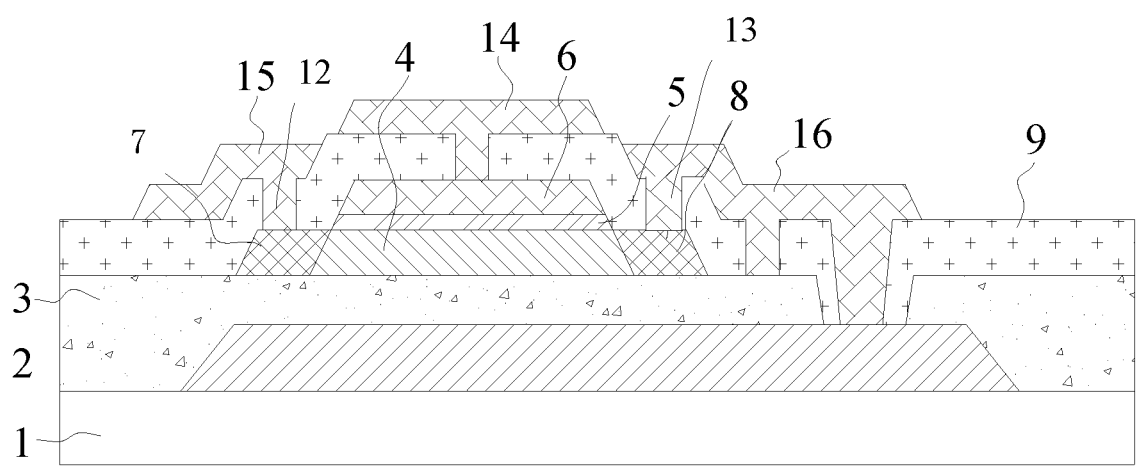
FIG. 18 is a schematic structural diagram of the thin film transistor fabricated by Step S210 of the fabrication method in FIG. 5.

As shown in FIG. 18, the gate line 14, the source line 15 and the drain line 16 may be formed on the surface of the dielectric layer 9 away from the substrate 1. Meanwhile, the gate line 14 is connected to the gate 6 through the first via hole 11. The source line 15 is connected to the source 7 through the second via hole 12. The drain line 16 is connected to the drain 8 through the third via hole 13, and the drain line 16 is also connected to the light shielding layer 2 through the contact hole 10.

The gate line 14, the source line 15, and the drain line 16 may be formed by one or more mask processes, which are not particularly limited herein. Materials of the gate line 14, the source line 15, and the drain line 16 may be molybdenum, aluminum, or copper, but are not limited thereto, and also may be chromium, tungsten, titanium, tantalum, and alloys thereof, etc., which are not enumerated herein.

An embodiment of the present disclosure provides a thin-film transistor. As shown in FIG. 18, the thin-film transistor may be a top-gate type thin-film transistor and may be fabricated by the fabrication method for fabricating a thin-film transistor of the above embodiments. The thin-film transistor includes: a substrate 1; a light shielding layer 2 formed on a substrate; a buffer layer 3 covering the light shielding layer 2; an active layer 4 covering a partial region of the buffer layer 3; a gate insulator layer 5 formed on a surface of the active layer away from the substrate; a gate 6 stacked on a surface of the gate insulator layer 5 away from the substrate; a source 7 and a drain 8 formed on the surface of the buffer layer away from the substrate; a dielectric layer 9 covering the gate, the source, the drain, and the buffer layer, a through hole 200 penetrating through the buffer layer and the dielectric layer, and the light shielding layer being exposed from the through hole, the dielectric layer being recessed into the through hole in correspondence to a region of the through hole to form a groove; and a contact hole 10 formed in the dielectric layer recessed into the through hole, and the light shielding layer being exposed from the through hole.

The thin-film transistor further includes a first via hole, a second via hole, and a third via hole formed on the dielectric layer, the gate being exposed from the first via hole, the source being exposed from the second via hole, and the drain being exposed from the third via hole; a gate line, a source line, and a drain line arranged at intervals on a surface of the dielectric layer away from the active layer, the gate line being connected to the gate via the first via hole, the source line being connected to the source via the second via hole, and the drain line being connected to the drain via the third via hole and being connected to the light shielding layer via the contact hole.

Beneficial effects of the thin-film transistor and specific details of the various portions have been described in detail in the corresponding embodiments of the fabrication method, and thus are not to be described in detail herein.

An embodiment of the present disclosure provides an array substrate, which may include the above thin-film transistor, and the array substrate may be an OLED array substrate or a liquid-crystal display (LCD) array substrate. Reference may be made to the beneficial effects of the fabrication method of the embodiments of the present disclosure for the beneficial effects of the array substrate, which are not described in detail herein.

An embodiment of the present disclosure provides a display panel, which may include the above array substrate. The display panel may be used in a terminal device having a display function, such as a mobile phone, a tablet computer, or a television, etc. Reference may be made to the beneficial effects of the fabrication method of the embodiments of the present disclosure for the beneficial effects of the display panel, which are not described in detail herein.

Other embodiments of the present disclosure will be apparent to those skilled in the art from consideration of the specification and practice of the invention disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A fabrication method for fabricating a thin-film transistor, comprising:
    forming a light shielding layer on a substrate;
    forming a buffer layer covering the light shielding layer, and forming a semiconductor material layer stacked on a surface of the buffer layer away from the substrate;
    forming a through hole penetrating through the buffer layer and the semiconductor material layer, the light shielding layer being exposed from the through hole;
    patterning the semiconductor material layer to form an active layer covering a partial region of the buffer layer;
    forming a gate insulator layer on a surface of the active layer away from the substrate and a gate stacked on a surface of the gate insulator layer away from the substrate;
    forming a source and a drain on the surface of the buffer layer away from the substrate; and
    forming a dielectric layer covering the gate, the source, the drain, and the buffer layer, the dielectric layer being recessed into the through hole in correspondence to a region of the through hole to form a groove;
    wherein forming the through hole penetrating through the buffer layer and the semiconductor material layer, and the light shielding layer being exposed from the through hole comprises:
        forming a photoresist layer on a surface of the semiconductor material layer away from the buffer layer;
        exposing and developing the photoresist layer via a graytone mask to facilitate the photoresist layer to form a removal region, a retention region, and a partial retention region, the removal region comprising an opening hole from which the semiconductor material layer is exposed, and the opening hole being positioned within the partial retention region; and
        etching the semiconductor material layer along the opening hole until the through hole from which the light shielding layer is exposed is formed.

2. The fabrication method according to claim 1, wherein patterning the semiconductor material layer to form the active layer covering the partial region of the buffer layer comprises:
    removing the partial retention region of the photoresist layer;
    removing a region of the semiconductor material layer that is not covered by the retention region; and removing the retention region of the photoresist layer to form the active layer.

3. The fabrication method according to claim 1, wherein the forming of the gate insulator layer on the surface of the active layer away from the substrate and the gate stacked on the surface of the gate insulator layer away from the substrate comprises:
   forming an insulating material layer covering the active layer and the buffer layer;
   forming the gate on a surface of the insulating material layer away from the active layer, the gate covering a partial region of the insulating material layer, and an orthographic projection of the gate on the active layer being positioned within the active layer; and
   patterning the insulating material layer to form the gate insulator layer.

4. The fabrication method according to claim 3, wherein the forming of the through hole penetrating through the buffer layer and the semiconductor material layer, and the light shielding layer being exposed from the through hole comprise:
   forming a photoresist layer on a surface of the semiconductor material layer away from the buffer layer;
   exposing and developing the photoresist layer via a gray-tone mask to facilitate the photoresist layer to form a removal region, a retention region, and a partial retention region, the removal region comprising an opening hole from which the semiconductor material layer is exposed, and the opening hole being positioned within the partial retention region; and
   etching the semiconductor material layer along the opening hole until the through hole from which the light shielding layer is exposed is formed.

5. The fabrication method according to claim 4, wherein patterning the semiconductor material layer to form the active layer covering the partial region of the buffer layer comprises:
   removing the partial retention region of the photoresist layer;
   removing a region of the semiconductor material layer that is not covered by the retention region; and
   removing the retention region of the photoresist layer to form the active layer.

6. The fabrication method according to claim 3, wherein:
   the active layer comprises a peripheral region and a channel region positioned in the peripheral region;
   patterning of the insulating material layer to form the gate insulator layer comprises removing a region of the insulating material layer not covering the channel region to form the gate insulator layer, an orthographic projection of the gate insulator layer on the active layer coinciding with the channel region; and
   forming the gate insulator layer on the surface of the active layer away from the substrate by conducting at least a portion of the peripheral region to form the source and the drain respectively positioned on two sides of the channel region.

7. The fabrication method according to claim 6, wherein:
   the surface of the dielectric layer away from the substrate comprises a first face and a second face, wherein the first face is parallel to and directly faces the gate and the second face is parallel to and directly faces the drain; and
   a spacing between the first face and the gate, a spacing between the second face and the drain, and a spacing between a bottom surface of the groove and the light shielding layer are equal.

8. The fabrication method according to claim 6, wherein the forming of the through hole penetrating through the buffer layer and the semiconductor material layer, and the light shielding layer being exposed from the through hole comprise:
   forming a photoresist layer on a surface of the semiconductor material layer away from the buffer layer;
   exposing and developing the photoresist layer via a gray-tone mask to facilitate the photoresist layer to form a removal region, a retention region, and a partial retention region, the removal region comprising an opening hole from which the semiconductor material layer is exposed, and the opening hole being positioned within the partial retention region; and
   etching the semiconductor material layer along the opening hole until the through hole from which the light shielding layer is exposed is formed.

9. The fabrication method according to claim 8, wherein patterning the semiconductor material layer to form the active layer covering the partial region of the buffer layer comprises:
   removing the partial retention region of the photoresist layer;
   removing a region of the semiconductor material layer that is not covered by the retention region; and
   removing the retention region of the photoresist layer to form the active layer.

10. The fabrication method according to claim 6, further comprising:
    forming a contact hole from which the light shielding layer is exposed along the groove;
    forming a first via hole, a second via hole, and a third via hole on the dielectric layer, the gate being exposed from the first via hole, the source being exposed from the second via hole, and the drain being exposed from the third via hole; and
    forming a gate line, a source line, and a drain line arranged at intervals on a surface of the dielectric layer away from the active layer, the gate line being connected to the gate via the first via hole, the source line being connected to the source via the second via hole, and the drain line being connected to the drain via the third via hole and being connected to the light shielding layer via the contact hole.

11. The fabrication method according to claim 10, wherein the forming of the through hole penetrating through the buffer layer and the semiconductor material layer, and the light shielding layer being exposed from the through hole comprise:
    forming a photoresist layer on a surface of the semiconductor material layer away from the buffer layer;
    exposing and developing the photoresist layer via a gray-tone mask to facilitate the photoresist layer to form a removal region, a retention region, and a partial retention region, the removal region comprising an opening hole from which the semiconductor material layer is exposed, and the opening hole being positioned within the partial retention region; and
    etching the semiconductor material layer along the opening hole until the through hole from which the light shielding layer is exposed is formed.

12. The fabrication method according to claim 11, wherein patterning the semiconductor material layer to form the active layer covering the partial region of the buffer layer comprises:
    removing the partial retention region of the photoresist layer;

removing a region of the semiconductor material layer that is not covered by the retention region; and removing the retention region of the photoresist layer to form the active layer.

\* \* \* \* \*